(12) United States Patent
Park et al.

(10) Patent No.: US 7,112,529 B2
(45) Date of Patent: Sep. 26, 2006

(54) METHOD OF IMPROVING RESIDUE AND THERMAL CHARACTERISTICS OF SEMICONDUCTOR DEVICE

(75) Inventors: Sung-hyung Park, Chungcheongbuk-do (KR); Hi-Deok Lee, Daejeon-Si (KR)

(73) Assignee: Magnachip Semiconductor, Ltd., Chungcheonbuk-do (KR)

( * ) Notice: Subject to any disclaimer, the term of this patent is extended or adjusted under 35 U.S.C. 154(b) by 66 days.

(21) Appl. No.: 10/994,440

(22) Filed: Nov. 22, 2004

(65) Prior Publication Data

US 2005/0227486 A1    Oct. 13, 2005

(30) Foreign Application Priority Data

Apr. 9, 2004    (KR) .................. 10-2004-0024598

(51) Int. Cl.
*H01L 21/44* (2006.01)
(52) U.S. Cl. .................. 438/682; 438/591; 438/663
(58) Field of Classification Search ........... 438/591, 438/592, 642, 643, 655, 663, 664, 682
See application file for complete search history.

(56) References Cited

U.S. PATENT DOCUMENTS

| 6,117,793 | A | 9/2000 | Tang |
| 6,274,470 | B1 | 8/2001 | Ichimori et al. |
| 6,383,922 | B1 | 5/2002 | Zhang et al. |
| 6,828,236 | B1 * | 12/2004 | Lee ............................ 438/683 |
| 2002/0142616 | A1 * | 10/2002 | Giewont et al. ............ 438/745 |
| 2004/0007724 | A1 * | 1/2004 | Murthy et al. .............. 257/288 |

* cited by examiner

*Primary Examiner*—Phuc T. Dang
(74) *Attorney, Agent, or Firm*—Marshall, Gerstein & Borun LLP

(57) ABSTRACT

Disclosed herein is a method of improving residue and thermal characteristics of a semiconductor device. The method comprises the steps of a) depositing nickel and cobalt layers sequentially on a silicone substrate having a transistor formed thereon, b) depositing a capping layer on the cobalt layer, c) forming a silicide layer from the cobalt and nickel layers deposited on the silicone substrate by heat treatment, and d) wet etching to remove a residue. As the silicide layer is formed by additionally deposing the capping layer of titanium nitride on triple layers of silicone, cobalt and nickel, thermal stability for a thermal process performed when forming the silicide is ensured, and as resistance caused by an etchant is eliminated by the subsequent etching process, the residue is completely removed.

12 Claims, 4 Drawing Sheets

METHOD OF IMPROVING RESIDUE AND THERMAL CHARACTERISTICS OF SEMICONDUCTOR DEVICE

BACKGROUND OF THE INVENTION

1. Field of the Invention

The present invention relates to a method of improving residue and thermal characteristics of a semiconductor device, and more particularly to a method of improving residue and thermal characteristics of a semiconductor device, which forms a silicide by adding a capping layer of titanium nitride (TiN) on the existing triple layers of Si, Co and Ni, thereby solving a problem of residue remaining thereon and ensuring an enhanced thermal stability when manufacturing the semiconductor device.

2. Description of the Related Art

A continuing trend in current logic technology of 0.13 μm or less is to replace cobalt silicide with nickel silicide for enhancing a short channel effect. Nickel silicide applications are expanding to a nano-CMOS (Complementary Metal Oxide Semiconductor) due to its advantages in that nickel silicide can have a constant sheet resistance according to a line-width even in a fine line-width less than 0.10 μm as well as a low silicone consumption rate and a low specific resistance.

However, compared with cobalt silicide, since nickel silicide exhibits unstable thermal characteristics, such as phase transformation toward $NiSi_2$ or easy occurrence of cohesion, during an interlayer dielectric film deposition process, a contact heat process and the like, which are subsequent processes carried out after forming the silicide, it is required to settle these problems without delay.

Thus, in order to solve the problems, a conventional method forms a silicide layer through a heat treatment process after depositing double layers of cobalt/nickel (Co/Ni) or nickel/cobalt (Ni/Co) on a silicone substrate having a transistor formed thereon.

However, in the conventional method for providing the thermal stability using the double layers of cobalt/nickel or nickel/cobalt, a compound consisting of Si, Co and Ni is formed by a reaction of these elements and the compound exhibits a strong resistance against an etching liquid, so that a residue remaining after formation of the silicide continues to remain on a side wall and a field after an etching process, causing a problem in that a bridge can be easily formed.

FIG. 1 is a diagram illustrating the problem caused by the residue remaining without being removed when the double layers of cobalt/nickel or nickel/cobalt are used in the conventional method without a capping layer.

That is, according to the conventional method, even though a wet etching process is applied in order to remove the residue remaining after forming the silicide, the residue still remains without being completely removed.

SUMMARY OF THE INVENTION

The present invention has been made to solve the above problems, and it is an object of the present invention to provide a method of improving residue and thermal characteristics of a semiconductor device, which forms a silicide by adding a capping layer of titanium nitride onto triple layers of silicone, cobalt and nickel, thereby solving a problem caused by residue remaining thereon and ensuring an enhanced thermal stability when manufacturing the semiconductor device.

In accordance with one aspect of the present invention, the above and other objects can be accomplished by the provision of a method of improving residue and thermal characteristics of a semiconductor device, comprising the steps of: a) depositing nickel and cobalt layers sequentially on a silicone substrate having a transistor formed thereon; b) depositing a capping layer on the cobalt layer; c) forming a silicide layer from the nickel and cobalt layers deposited on the silicone substrate by heat treatment; and d) wet-etching to remove a residue.

In accordance with another aspect of the present invention, there is provided a method of improving residue and thermal characteristics of a semiconductor device, comprising the steps of: a) depositing cobalt and nickel layers sequentially on a silicone substrate having a transistor formed thereon; b) depositing a capping layer on the nickel layer; c) forming a silicide layer from the cobalt and nickel layers deposited on the silicone substrate by heat treatment; and d) wet-etching to remove a residue.

The nickel may be deposited to a thickness of 100 Å at the same temperature as that of the silicone substrate under conditions of a power of 100~200 W, a vacuum pressure of 1 mTorr, and a substrate distance of 13 cm, 15 cm or 17 cm.

The cobalt may be deposited to a thickness of 10 Å at the same temperature as that of the silicone substrate under conditions of a power of 100~200 W, a vacuum pressure of 1 mTorr, and a substrate distance of 13 cm, 15 cm or 17 cm.

The capping layer may be deposited to a thickness of 100 Å at the same temperature as that of the silicone substrate under conditions of a power of 200~300 W, a vacuum pressure of 1 mTorr, and a substrate distance of 13 cm, 15 cm or 17 cm.

The heat treatment may be carried out by a rapid thermal process (RTP) at a temperature of 500~700° C. for 30 seconds, 60 seconds or 90 seconds, forming the silicide layer.

The wet etching process may be carried out for 15 minutes using a mixture of $H_2SO_4$ and $H_2O_2$ in a ratio of 4:1.

The capping layer may be a titanium nitride film.

According to the method of the invention, the silicide is formed by additionally depositing the capping layer of titanium nitride on the triple layers of silicone, cobalt and nickel, thereby ensuring the thermal stability for a thermal process performed when forming the silicide, and a resistance caused by an etchant is removed during the subsequent etching process, thereby completely removing the residue.

BRIEF DESCRIPTION OF THE DRAWINGS

The foregoing and other objects and features of the present invention will be more clearly understood from the following detailed description taken in conjunction with the accompanying drawings, in which.

DESCRIPTION OF THE PREFERRED EMBODIMENTS

Preferred embodiments will now be described in detail with reference to the accompanying drawings. These embodiments are provided for the purpose of illustration, and it should be not considered that the scope of the invention is limited by these embodiments.

FIGS. 2a to 2d are cross sections showing steps for manufacturing a semiconductor device according to the present invention.

Figure 1:
FIG. 1 is a diagram illustrating a problem caused by a conventional method of removing a residue.
Figure 2A:
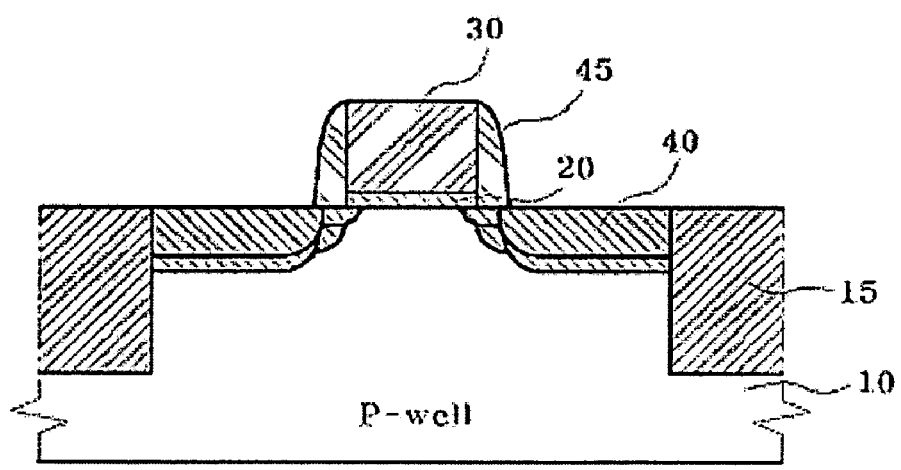
FIGS. 2a to 2d are cross sections showing steps for manufacturing a semiconductor device according to the present invention.

First, as shown in FIG. 2a, a gate consisting of a gate oxide film 20 and a poly-silicone 30 is formed on a silicone substrate 10, which is formed with a device separating film 15 and defined with a P-well, and spacers 45 of a dielectric film are then formed at both sides of the gate. Then, impurities are injected into the silicone substrate 10 at lower portions of both sides of the gate, forming source/drain regions 40 to complete a transistor.

Figure 2B:
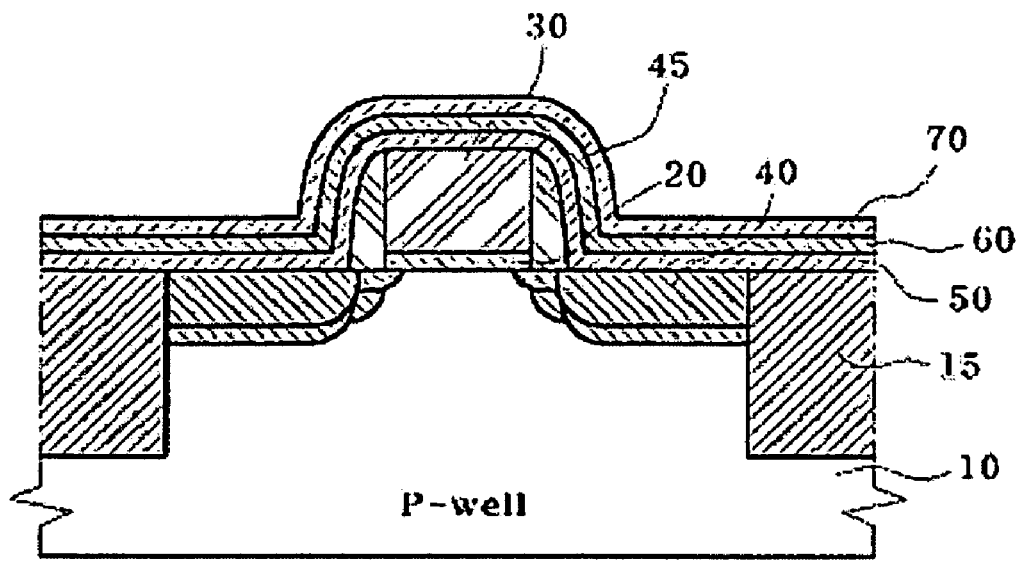

Then, as shown in FIG. 2b, a nickel layer 50 and a cobalt layer 60 are sequentially deposited on the transistor such that the nickel layer 50 and the cobalt layer 60 have a thickness of 100 Å and of 10 Å, respectively.

Here, the cobalt layer 60 may be deposited prior to the nickel layer 50.

Further, preferably, the cobalt layer 60 and the nickel layer 50 is deposited at the same temperature as that of the silicone substrate under conditions of a power of 100~200 W, a base pressure of 3E-7 Torr, a vacuum pressure of 1 mTorr, and a substrate distance of 13 cm, 15 cm or 17 cm between a deposition source and the silicone substrate.

Next, a titanium nitride layer 70 is deposited as a capping layer on the cobalt layer 60 on the nickel layer 50 or the nickel layer 50 on the cobalt layer 60 such that the titanium nitride layer 70 has a thickness of 100 Å.

Here, preferably, the titanium nitride layer 70 is deposited at the same temperature as that of the silicone substrate under conditions of a power of 200~300 W, a base pressure of 3E-7 Torr, a vacuum pressure of 1 mTorr, and a substrate distance of 13 cm, 15 cm or 17 cm between a deposition source (not shown) and the silicone substrate.

Then, the titanium nitride layer 70 deposited on the cobalt layer 60 or the nickel layer 50 is heat treated at a temperature of 550° C. for 60 seconds with a rapid thermal process (RTP) to form a silicide.

Here, in addition to the above conditions, the RTP may be carried out at a temperature of 500~700° C. for 30 seconds, 60 seconds or 90 seconds.

Figure 2C:
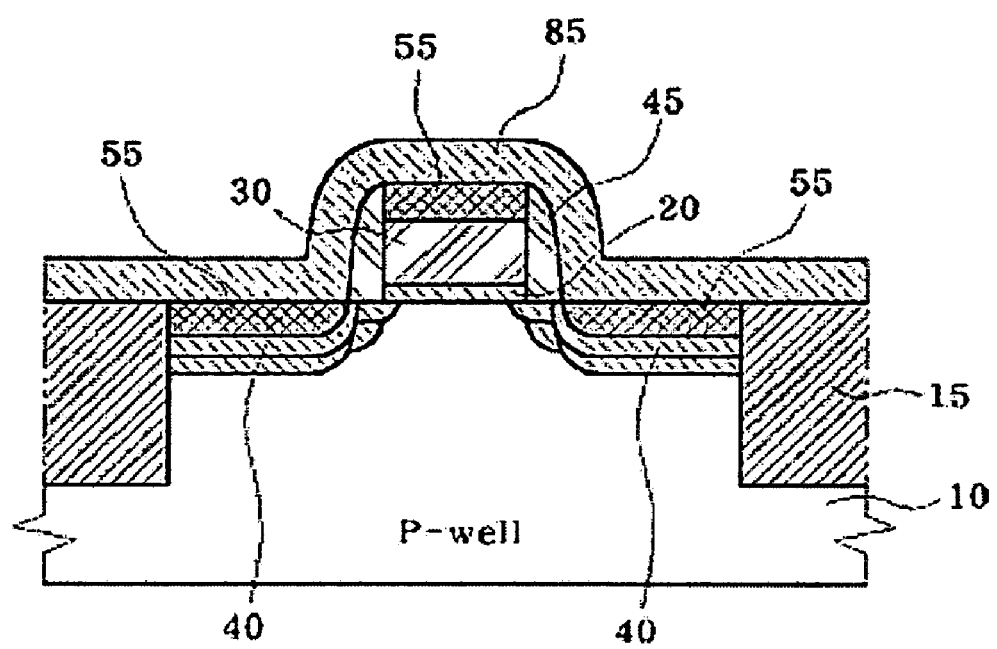

Then, as shown in FIG. 2c, silicide layers 55 are formed by a selective reaction at portions where silicone is present. That is, there exists a non-silicide metal layer 85, under which the silicide layers 55 are formed only at the upper surface of the poly-gate 30 in the gate and at the source/drain regions 40 of the silicone substrate 10, and the silicide layer is not formed at the other portions of the silicon substrate.

Describing the present invention in detail with reference to the conventional method, the conventional method has the problems in that when a compound consisting of Si, Co and Ni is formed by a rapid reaction of the silicone layer, the cobalt layer 60 and the nickel layer 50, the compound exhibits a strong resistance against an etching liquid, so that a residue remaining after formation of the silicide layers 55 continues to remain on the side wall spacers 45 and on the device separating film 15 after an etching process.

However, as described above, in the present invention, the capping layer 70 of titanium nitride is additionally deposited on the layers of silicone, cobalt and nickel, so that the capping layer 70 can absorb a physical stress and retard a reaction rate during the heat treatment and the etching process, resulting in preventing the compound caused by the rapid reaction of the silicone layer, the cobalt layer 60 and the nickel layer 50 from being formed. As a result, there is no resistance against the etching liquid, which is caused by the compound in the conventional method, so that the residue can be completely removed by the etching process.

Further, the capping layer 70 of titanium nitride substantially prevents surrounding gases from participating in the reaction, so that thermal stability during the thermal process can be further enhanced.

Figure 2D:
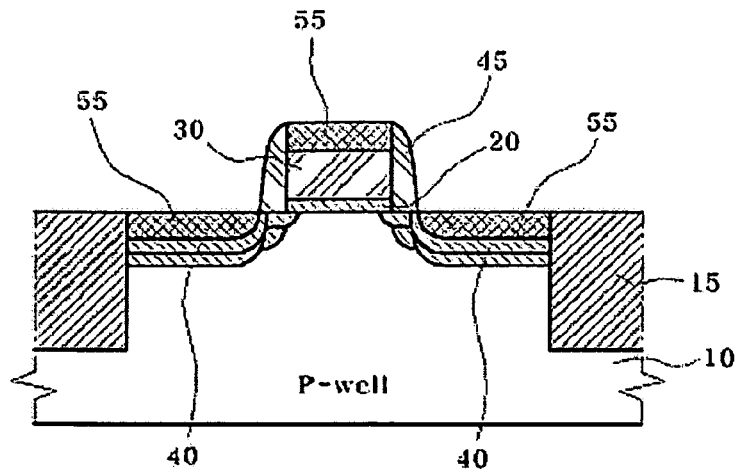

Finally, as shown in FIG. 2d, the non-silicide metal layer 85, which is not formed with the silicide layers 55, is removed by wet-etching the semiconductor deice formed with the silicide layers 55 therein.

Here, the wet etching is carried out for 15 minutes using a mixture of $H_2SO_4$ and $H_2O_2$ in a ratio of 4:1.

Figure 3:
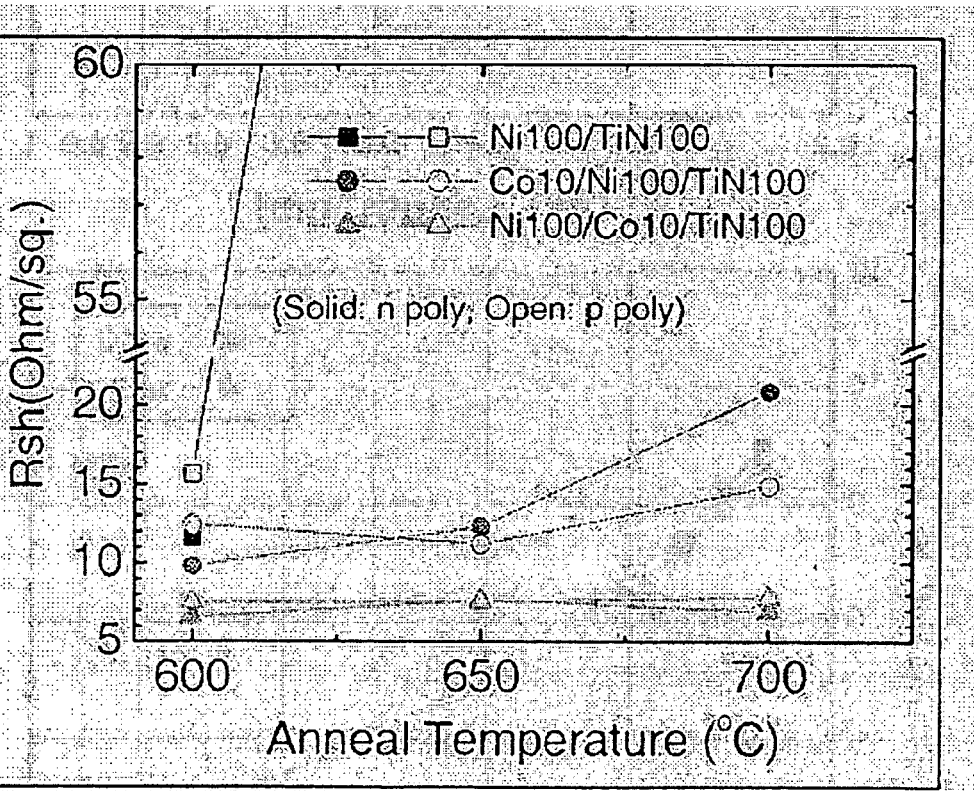
FIG. 3 is a graphical representation showing an enhancement of thermal stability according to the present invention.

FIG. 3 is a graphical representation showing that the semiconductor device according to the present invention has an excellent thermal stability, compared with that of the conventional method.

As shown in FIG. 3, the nickel/titanium nitride layers exhibit the worst thermal stability during the subsequent heat treatment process, whereas the nickel/cobalt/titanium nitride layers exhibits the best enhanced thermal stability during the subsequent heat treatment process.

Figure 4:
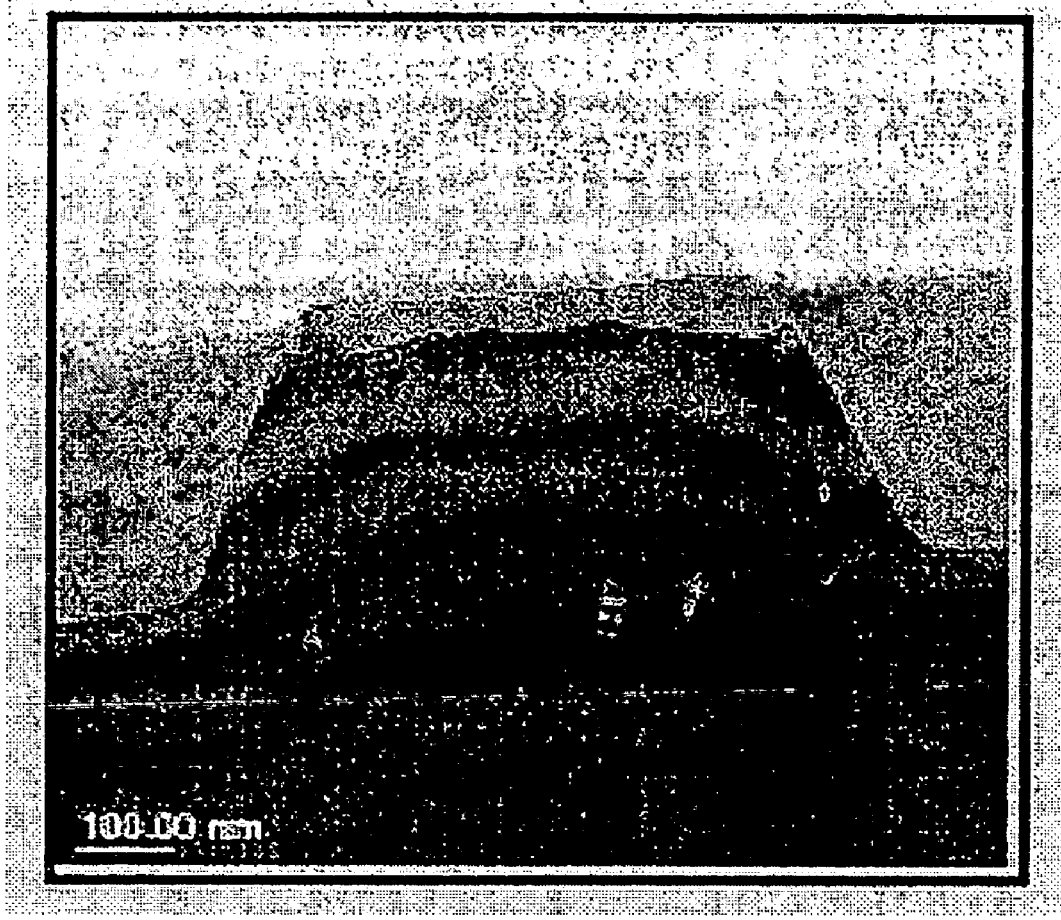
FIG. 4 is a diagram illustrating an improvement in residue removal according to the present invention.

FIG. 4 is a diagram showing that the residue is completely removed according to the present invention.

As shown in FIG. 4, after the silicide layer is formed by additionally depositing the capping layer of titanium nitride on the triple layers of silicone/nickel/cobalt, the etching process for removing the remaining residue is carried out, so that the residue is completely removed.

As apparent from the above description, according to the present invention, there are advantageous effects in that the silicide layer is formed by additionally deposing the capping layer of titanium nitride on the triple layers of silicone, cobalt and nickel, thereby ensuring the thermal stability for the thermal process performed when forming the silicide, and in that the resistance caused by an etchant is eliminated by the subsequent etching process, thereby completely removing the residue.

It should be understood that the embodiments and the accompanying drawings as described above have been described for illustrative purposes and the present invention is limited only by the following claims. Further, those skilled in the art will appreciate that various modifications, additions and substitutions are allowed without departing from the scope and spirit of the invention as set forth in the accompanying claims.

What is claimed is:

1. A method of improving residue and thermal characteristics of a semiconductor device, comprising the steps of:
   a) depositing nickel and cobalt layers sequentially on a silicone substrate having a transistor formed thereon;
   b) depositing a capping layer on the cobalt layer;
   c) forming a silicide layer from the nickel and cobalt layers deposited on the silicone substrate by heat treatment, wherein the heat treatment is carried out by a rapid thermal process at a temperature of 500~700° C. for 30 seconds, 60 seconds or 90 seconds; and
   d) wet etching to remove a residue.

2. A method of improving residue and thermal characteristics of a semiconductor device, comprising the steps of:
   a) depositing cobalt and nickel layers sequentially on a silicone substrate having a transistor formed thereon;
   b) depositing a capping layer on the nickel layer;
   c) forming a silicide layer from the cobalt and nickel layers deposited on the silicone substrate by heat treatment, wherein the heat treatment is carried out by a rapid thermal process at a temperature of 500~700° C. for 30 seconds, 60 seconds or 90 seconds; and
   d) wet-etching to remove a residue.

3. The method as set forth in claim 1, wherein the nickel is deposited to a thickness of 100 Å at the same temperature as that of the silicone substrate under conditions of a power of 100~200 W, a vacuum pressure of 1 mTorr, and a substrate distance of 13 cm, 15 cm or 17 cm.

4. The method as set forth in claim 1, wherein the cobalt is deposited to a thickness of 10 Å at the same temperature as that of the silicone substrate under conditions of a power of 100~200 W, a vacuum pressure of 1 mTorr, and a substrate distance of 13 cm, 15 cm or 17 cm.

5. The method as set forth in claim 1, wherein the capping layer is deposited to a thickness of 100 Å at the same temperature as that of the silicone substrate under conditions of a power of 200~300 W, a vacuum pressure of 1 mTorr, and a substrate distance of 13 cm, 15 cm or 17 cm.

6. The method as set forth in claim 1, wherein the wet etching process is carried out for 15 minutes using a mixture of $H_2SO_4$ and $H_2O_2$ in a ratio of 4:1.

7. The method as set forth in claim 1, wherein the capping layer is a titanium nitride film.

8. The method as set forth in claim 2, wherein the nickel is deposited to a thickness of 100 Å at the same temperature as that of the silicone substrate under conditions of a power of 100~200 W, a vacuum pressure of 1 mTorr, and a substrate distance of 13 cm, 15 cm or 17 cm.

9. The method as set forth in claim 2, wherein the cobalt is deposited to a thickness of 10 Å at the same temperature as that of the silicone substrate under conditions of a power of 100~200 W, a vacuum pressure of 1 mTorr, and a substrate distance of 13 cm, 15 cm or 17 cm.

10. The method as set forth in claim 2, wherein the capping layer is deposited to a thickness of 100 Å at the same temperature as that of the silicone substrate under conditions of a power of 200~300 W, a vacuum pressure of 1 mTorr, and a substrate distance of 13 cm, 15 cm or 17 cm.

11. The method as set forth in claim 2, wherein the wet etching process is carried out for 15 minutes using a mixture of $H_2SO_4$ and $H_2O_2$ in a ratio of 4:1.

12. The method as set forth in claim 2, wherein the capping layer is a titanium nitride film.

* * * * *